United States Patent [19]

Cukauskas

[11] 4,426,268

[45] Jan. 17, 1984

[54] METHOD FOR FORMING HIGH SUPERCONDUCTING $T_c$ NIOBIUM NITRIDE FILM AT AMBIENT TEMPERATURES

[75] Inventor: Edward J. Cukauskas, Vienna, Va.

[73] Assignee: The United States of America as represented by the Secretary of the Navy, Washington, D.C.

[21] Appl. No.: 513,195

[22] Filed: Jul. 12, 1983

[51] Int. Cl.$^3$ .............................................. C23C 15/00
[52] U.S. Cl. ............................ 204/192 C; 204/192 S; 204/192 R
[58] Field of Search ......................... 204/192 C, 192 S

[56] References Cited

U.S. PATENT DOCUMENTS

| | | | |
|---|---|---|---|
| 3,988,178 | 10/1976 | Dahlgren | 204/192 S |
| 4,220,959 | 9/1980 | Kroger | 357/5 |
| 4,279,969 | 7/1981 | Francavilla | 204/192 S |
| 4,299,679 | 11/1981 | Suzuki | 204/192 EC |
| 4,299,861 | 11/1981 | Dietrich et al. | 427/62 |

OTHER PUBLICATIONS

Wolf et al. J. Vac. Sci. Tech. 17 (1980), pp. 411–414.
Gavaler et al. Appl Phys. Lett. 19 (1971), pp. 305–307.
Keskas et al. Jap. J. Appl. Phys. 10 (1971), pp. 370–374.
Kosaka et al. Jap. J. App. Phys. 21 (1982) Supp. 21, pp. 319–324.
Aubert et al. Thin Solid Films 96 (1982), pp. 191–198.
Akune Jap. J. Appl. Phys. 21 (1982), pp. 772–775.

*Primary Examiner*—Arthur P. Demers
*Attorney, Agent, or Firm*—Robert F. Beers; William T. Ellis; Charles E. Krueger

[57] ABSTRACT

A method of forming a high $T_c$ niobium nitride (NbN) film on a substrate at ambient substrate temperature. The method includes the step of reactively sputtering NbN onto the substrate in an argon-nitrogen atmosphere with controlled amounts of methane added to the argon-nitrogen gas mixture.

9 Claims, 2 Drawing Figures

ULTRA HIGH VACUUM SYSTEM
USED TO PREPARE NIOBIUM
NITRIDE

METHOD FOR FORMING HIGH SUPERCONDUCTING $T_c$ NIOBIUM NITRIDE FILM AT AMBIENT TEMPERATURES

BACKGROUND OF THE INVENTION

1. Field of the Invention

The present invention relates generally to a method for depositing a superconducting film of niobium nitride (NbN) without substrate heating and more particularly to depositing a NbN film with a superconducting transition temperature ($T_c$) comparable to the $T_c$ of bulk NbN.

2. Description of the Prior Art

A Josephson junction tunnel device is a multilayer structure including two electrodes separated by a barrier. There has been considerable interest in the fabrication of Josephson tunnel devices using refractory niobium nitride (NbN) thin film electrodes. This electrode material has several pronounced advantages compared to other materials that have been used previously: high $T_c$, stable B1 crystal structure, resistance to radiation damage and ease of preparation. The quantity $T_c$ is the temperature below which a material is superconductive. $T_c$ is not actually a single value but is characterized by a transition width, $\Delta T_c$. It is generally desirable to maximize $T_c$ in order to minimize cooling requirements.

Typically, these high $T_c$ NbN films are reactively sputtered onto a heated substrate by a d.c., r.f. or magnetron sputtering technique utilizing a niobium target cathode in an argon/nitrogen atmosphere. When the substrate is maintained at or near ambient temp during the growth of the films it is observed that Nb-N compounds are formed which have superconducting transition temperatures which are usually below 10° K. with the highest values approaching 12° K. In order to obtain thin deposited films with $T_c$ approaching 16° K., the value for bulk NbN, the substrate has to be heated to temperatures above 700° C. which assists in the formation of NbN compounds with suitable crystallographic structure and composition ratios which yield $T_c$ near the bulk value.

The high $T_c$ films formed utilizing heated substrates have been found to contain approximately 4% carbon as determined by Auger analysis. This presence of carbon is believed to account for the high $T_c$ of these films.

It is advantageous to obtain electrodes with a high $T_c$ in order to reduce the need to maintain the Josephson junction tunneling device at extremely low temperatures. However, the substrate heating required by the existing fabrication methods described above degrades the preformance of the device.

Thus, when existing electrode fabrication methods are used, either a low $T_c$ film may be deposited without substrate heating or a high $T_c$ film may be deposited with substrate heating and the attendant disadvantages thereof.

OBJECTS OF THE INVENTION

Accordingly, one object of the present invention is to increase the $T_c$ of a thin NbN film deposited on an unheated substrate.

It is a further object of the present invention to facilitate the fabrication of high performance Josephson junction tunneling devices that do not require cooling to temperatures below the $T_c$ of bulk NbN.

It is still a further object of the invention to introduce carbon in the NbN film without heating the substrate.

SUMMARY OF THE INVENTION

The above and other objects are achieved in the present invention which is a method for forming a high $T_c$ niobium nitride (NbN) film on an unheated substrate. The method includes the step of introducing carbon into the NbN film. In one embodiment of the method, a niobium target cathode and a substrate are positioned within a sputtering chamber with a gas mixture including nitrogen and methane introduced therein. The NbN film is then reactively sputtered onto the substrate which is maintained at ambient temperature.

The NbN film deposited by the above-described method has been determined to have a $T_c$ near the value for bulk NbN. Since the substrate was not heated a Josephson junction tunneling device utilizing the film would not have its performance degraded by the effects of substrate heating. Thus, the device would be characterized by high $T_c$ and high performance.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention is a method for depositing a thin film of niobium nitride (NbN) characterized by a $T_c$ value near to that of bulk NbN that does not require substrate heating.

As described above, it is believed that the presence of carbon in the deposited film increases its $T_c$. In the method described below this carbon is introduced into the film during reactive sputtering deposition of the film in an atmosphere including methane, $CH_4$.

Figure 1:
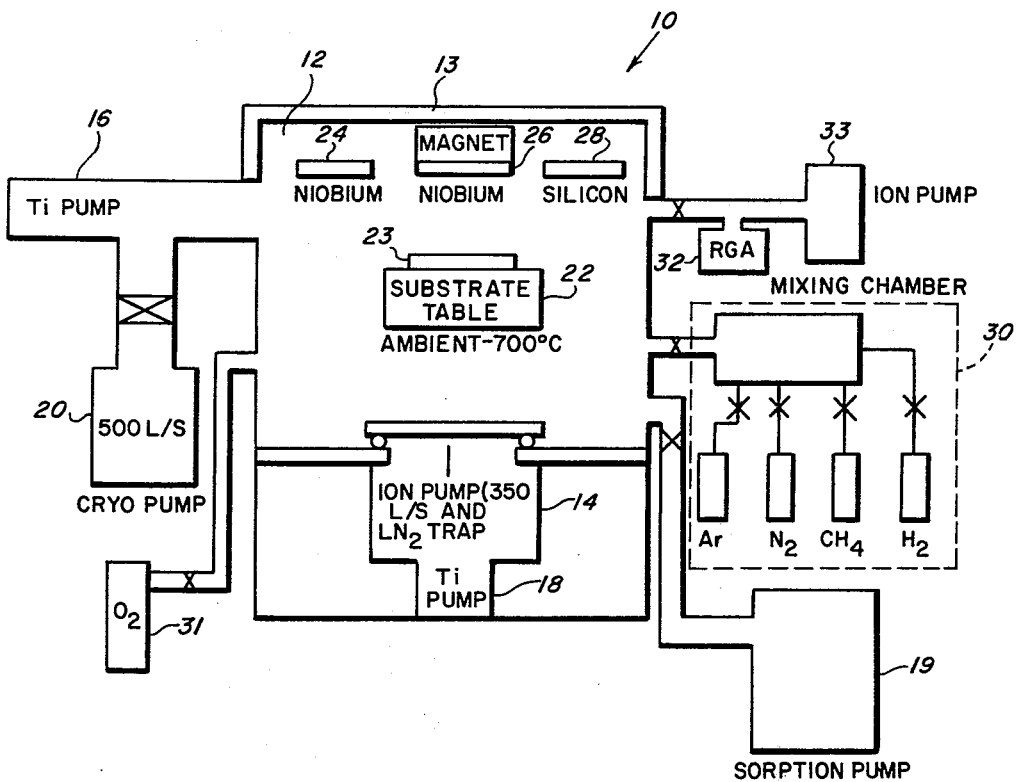
FIG. 1 is a schematic diagram of an apparatus for depositing high $T_c$ NbN films.

Referring now to the drawings, wherein like reference numerals designate identical or corresponding parts throughout the several views, and more particularly to FIG. 1 thereof, a schematic diagram of an apparatus utilized to practice the method of the invention is presented by way of example. The apparatus is an ultra high vacuum sputtering system 10 including a stainless steel sputtering chamber 12, with a cryo shroud 13 for cooling. The chamber 12 was typically pumped to a residual pressure of about $7 \times 10^{-7}$ Pascals by a 350 liter/sec. ion pump 14, two titanium sublimation pumps 16 and 18, a sorption pump 19 a 500 liter/sec. and a cryo pump 20. A substrate table 22, for holding a substrate 23, is mounted in the sputtering chamber 12. The substrate table 22 includes 3 internal quartz iodine heaters for heating the substrate up to 700° C. Two niobium target cathodes 24 and 26 and one silicon cathode 28 are also mounted in the sputtering chamber 12. A first niobium target 26 is used in the r.f. magnetron sputtering mode while the other two targets 24 and 28 operate in the r. f. diode sputtering mode. Appended to the sputtering chamber 12 is a one liter mixing chamber 30 for precisely preparing the gas mixture to be utilized during the deposition of the NbN film and an oxygen supply 31. A differentially pumped residual gas analyzer (RGA) 32 with an associated ion pump 33 is utilized to monitor background system pressure prior to and during deposition.

The film preparation sequence actually utilized in one experiment begins by first loading precleaned polished quartz and/or silicon substrates 23 onto the substrate table 22 and pumping down with the cryo pump 20 during an 18-hour bake-out at 100° C. The stainless steel chamber 12 is then allowed to cool with all pumps active for approximately 5 hours. With the cryo shroud 13 cooled with liquid nitrogen, the system background pressure is typically less than $7 \times 10^{-7}$ Pascals, with hydrogen and helium being the major residual gases. Water vapor, nitrogen and carbon monoxide are normally presented at the mid $10^{-8}$ Pascal range with carbon dioxide and Argon in the $10^{-9}$ Pascal range. There are no other contaminants detectable to $10^{-11}$ Pascal using a VG Instruments Model SX-200 residual gas analyzer 32. At this point the cryo pump 20 is throttled and the other pumps turned off. The substrates are cleaned in situ by a 15-minute sputter etch at a power density of 1.4 watts/cm$^2$ in 2.5 Pascal of 99.999% Argon. The niobium target 24 is then presputtered at 2.9 watts/cm$^2$ in a 1.3 Pascals of pure Argon for 15 minutes. The desired gases are mixed in the appendage mixing chamber 30 and the plasma reestablished at 9 watts/cm$^2$ in a 1.3 Pascals total gas pressure. The niobium nitride films are then reactively sputtered at a rate of 20 nanometers/min. with the substrate 23 at a distance of 6 cm. from the target 24.

Under these conditions, niobium nitride films with nominal thicknesses of 400 nanometers were prepared using a total pressure of 1.3 Pascals, a partial pressure of nitrogen of 0.17 Pascals and with a partial pressure of methane ranging down from ambient background to 0.26 Pascals.

Figure 2:
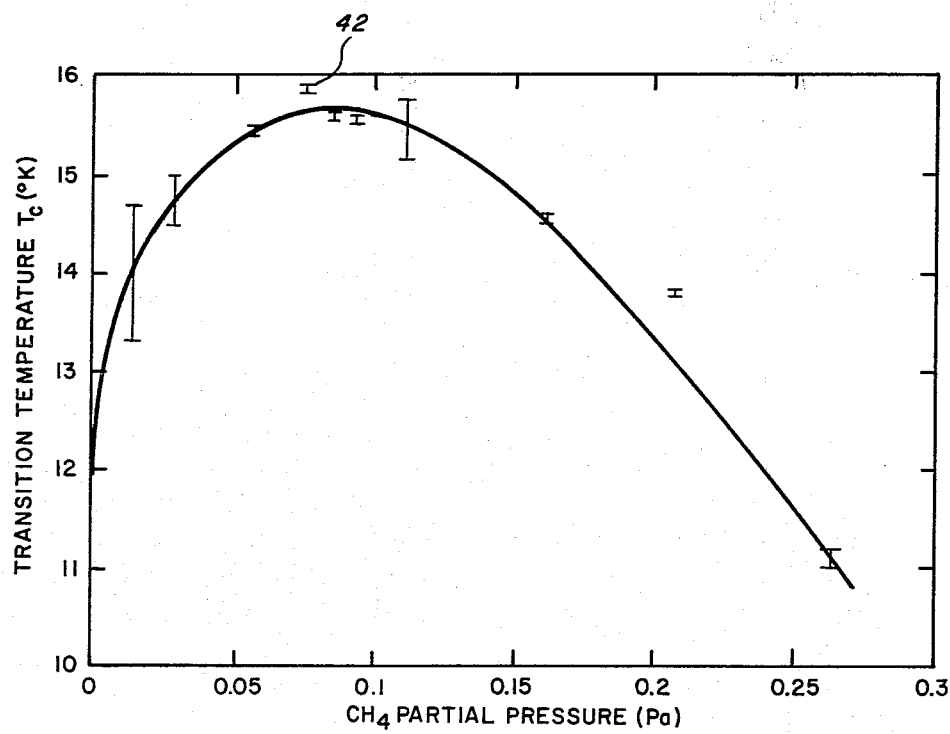
FIG. 2 is a graph of $T_c$ as a function of the partial pressure of methane.

FIG. 2 is a graph of the superconducting transition temperature ($T_c$) and transition width $\Delta T_c$ (error bars) 32 as a function of the partial pressure of methane, in Pascals, of the gas mixture utilized during the deposition process. Referring now to FIG. 2, note that as the amount of methane in the sputtering gas mixture is increased from 0 to 0.3 Pascals, the superconducting properties of the film improve, i.e. $T_c$ increases and the transition width 32 decreases. The quantity $T_c$ reaches a maximum of near 16° K. for a methane partial pressure of approximately 0.08 Pascals and falls with increasing methane pressure. Although the $T_c$ decreases with increasing methane presence, the transition width remains reasonably narrow up to a methane pressure of 0.2 Pascals.

One film prepared at 0.2 Pascals partial pressure of methane had a transition width of less than 50 milli degrees Kevin. A full discussion of the physical characteristics of the films produced is included in an article by the Applicant entitled "The effects of methane in the deposition of superconducting niobium nitride thin films at ambient substrate temperatures," J. Appl. Phys. 54 (2) February 1983, pp. 1013–1017.

Note that the total pressure of the gas mixture is not critical. The method described above could utilize a total pressure in the range of 1 to 10 Pascals. The partial pressure of methane should be from about 1% to about 20% of the total pressure. The remaining fraction of the gas mixture should be an inert gas such as argon. Additionally, the film thickness may vary over a substantial range of about 300 to 500 nanometers.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for forming a high $T_c$ niobium nitride film comprising the steps of:
   maintaining a substrate at ambient temperature;
   sputter depositing a niobium nitride (NbN) film from a niobium target cathode onto said substrate and introducing carbon into said NbN film.

2. The method recited in claim 1 wherein said step of introducing carbon includes the steps of;
   enclosing said target cathode and said substrate in a sputtering chamber; and
   maintaining a gas mixture in said chamber including nitrogen and methane during said step of sputter depositing said film.

3. The method recited in claim 2 further including the step of:
   terminating said step of sputter depositing when the thickness of said NbN film is about 400 nanometers.

4. A method for forming a high $T_c$ niobium nitride (NbN) film comprising the steps of:
   positioning a niobium target cathode and a substrate within a sputtering chamber;
   introducing a gas mixture including a nitrogen and methane into said chamber;
   maintaining said substrate at ambient temperature; and
   sputter depositing a film of NbN onto said substrate.

5. The method recited in claim 4 further including the step of;
   adjusting the value of the pressure of said gas mixture to be in the range of from about 1 Pascal to about 10 Pascals.

6. The method recited in claim 5 further including the step of:
   adjusting the partial pressure of nitrogen in said gas mixture to be about 13% of the total pressure of said gas mixture.

7. The method recited in claim 6 further including the step of:
   adjusting the partial pressure of methane to be about 1% to about 20% of the pressure of said gas mixture.

8. The method recited in claim 7 further including the step of:
   terminating said step of sputter depositing when the thickness of said NbN film is about 400 nanometers.

9. The method recited in claim 8 further including the step of:
   selecting said substrate material from the group consisting of quartz and glass.

* * * * *